United States Patent
Lai et al.

(10) Patent No.: US 9,881,872 B2
(45) Date of Patent: Jan. 30, 2018

(54) METHOD FOR FABRICATING A LOCAL INTERCONNECT IN A SEMICONDUCTOR DEVICE

(71) Applicant: TAIWAN SEMICONDUCTOR MANUFACTURING CO., LTD., Hsinchu (TW)

(72) Inventors: Jui-Yao Lai, Changhwa (TW); Sai-Hooi Yeong, Zhubei (TW); Ying-Yan Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/996,811

(22) Filed: Jan. 15, 2016

(65) Prior Publication Data

US 2017/0207166 A1    Jul. 20, 2017

(51) Int. Cl.
*H01L 29/80* (2006.01)
*H01L 29/76* (2006.01)
(Continued)

(52) U.S. Cl.
CPC .... *H01L 23/535* (2013.01); *H01L 21/823814* (2013.01); *H01L 21/823821* (2013.01);
(Continued)

(58) Field of Classification Search
CPC ......... H01L 21/76895; H01L 21/76897; H01L 2924/13091; H01L 23/535; H01L 2225/06541; H01L 27/228; H01L 21/823871; H01L 21/768

USPC ........ 257/213, 217, 263, 283, 302; 438/156, 438/157, 173, 180, 192, 212, 268, 299, 438/618
See application file for complete search history.

(56) References Cited

U.S. PATENT DOCUMENTS 7,049,218 B2    5/2006    Choi et al.
7,667,271 B2    2/2010    Yu et al.
(Continued)

FOREIGN PATENT DOCUMENTS

EP    2246895 A1    11/2010
JP    2004247735 A    9/2004
(Continued)

OTHER PUBLICATIONS

Office Action Taiwanese Patent Application No. 105125571 dated Mar. 27, 2017.
(Continued)

*Primary Examiner* — Hsien Ming Lee
(74) *Attorney, Agent, or Firm* — McDermott Will & Emery LLP

(57) ABSTRACT

A semiconductor device includes a first transistor having a first gate, a first source and a first drain, a second transistor having a second gate, a second source and a second drain, an isolation region separating the first transistor from the second transistor, and a local interconnect connecting at least one of the first source and the first drain to at least the second source and the second drain. The local interconnect is in contact with a surface of the at least one of the first source and the first drain, a surface of the at least the second source and the second drain and a surface of a part of the isolation region.

20 Claims, 13 Drawing Sheets

(51) Int. Cl.
*H01L 21/00* (2006.01)
*H01L 21/337* (2006.01)
*H01L 23/535* (2006.01)
*H01L 21/8238* (2006.01)
*H01L 27/092* (2006.01)
*H01L 29/08* (2006.01)
*H01L 29/16* (2006.01)
*H01L 29/161* (2006.01)
*H01L 29/165* (2006.01)
*H01L 29/24* (2006.01)
*H01L 29/66* (2006.01)
*H01L 29/78* (2006.01)

(52) U.S. Cl.
CPC ........ *H01L 21/823864* (2013.01); *H01L 21/823871* (2013.01); *H01L 21/823878* (2013.01); *H01L 27/0924* (2013.01); *H01L 29/0847* (2013.01); *H01L 29/161* (2013.01); *H01L 29/165* (2013.01); *H01L 29/1608* (2013.01); *H01L 29/24* (2013.01); *H01L 29/66515* (2013.01); *H01L 29/66545* (2013.01); *H01L 29/66636* (2013.01); *H01L 29/7848* (2013.01)

(56) References Cited

U.S. PATENT DOCUMENTS

| | | | |
|---|---|---|---|
| 7,910,453 | B2 | 3/2011 | Xu et al. |
| 8,377,779 | B1 | 2/2013 | Wang |
| 8,399,931 | B2 | 3/2013 | Liaw et al. |
| 8,497,548 | B2 * | 7/2013 | Masuoka ........ H01L 21/823885 257/329 |
| 8,652,894 | B2 | 2/2014 | Lin et al. |
| 8,686,516 | B2 | 4/2014 | Chen et al. |
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,735,993 | B2 | 5/2014 | Lo et al. |
| 8,736,056 | B2 | 5/2014 | Lee et al. |
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 2004/0209454 | A1 | 10/2004 | Choi et al. |
| 2010/0038721 | A1 | 2/2010 | Lin et al. |
| 2010/0127333 | A1 | 5/2010 | Hou et al. |
| 2012/0199896 | A1 * | 8/2012 | Noguchi ........ H01L 27/11524 257/296 |
| 2012/0326241 | A1 * | 12/2012 | Haran ............ H01L 21/28518 257/401 |
| 2013/0119474 | A1 | 5/2013 | Schultz |
| 2013/0249010 | A1 | 9/2013 | Ng et al. |
| 2014/0001574 | A1 | 1/2014 | Chen et al. |
| 2014/0061801 | A1 | 3/2014 | Doornbos et al. |
| 2014/0110755 | A1 | 4/2014 | Colinge |
| 2014/0151812 | A1 | 6/2014 | Liaw |
| 2016/0118496 | A1 * | 4/2016 | Anderson ........ H01L 29/66484 257/365 |

FOREIGN PATENT DOCUMENTS

| | | |
|---|---|---|
| JP | 2013-004791 A | 1/2013 |
| KR | 10-2010-0117618 A | 11/2010 |
| KR | 10-2014-0090680 A | 7/2014 |
| TW | 201013759 A | 4/2010 |
| TW | 201021160 A | 6/2010 |
| TW | 201349310 A | 12/2013 |
| TW | 201409665 A | 3/2014 |

OTHER PUBLICATIONS

Office Action Korean Patent Application No. 10-2016-0052457 dated Mar. 2, 2017.
Notice of Allowance issued in corresponding Korean Application 10-2016-0052457, dated Sep. 15, 2017; with English translation.

* cited by examiner

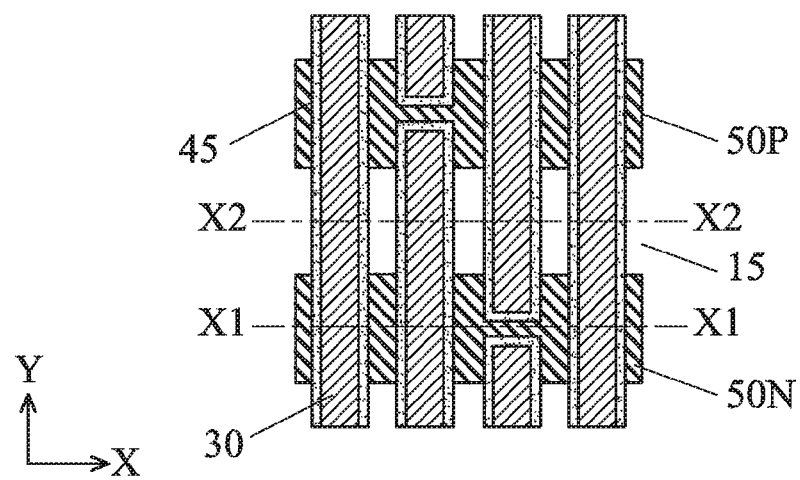
FIG. 7A
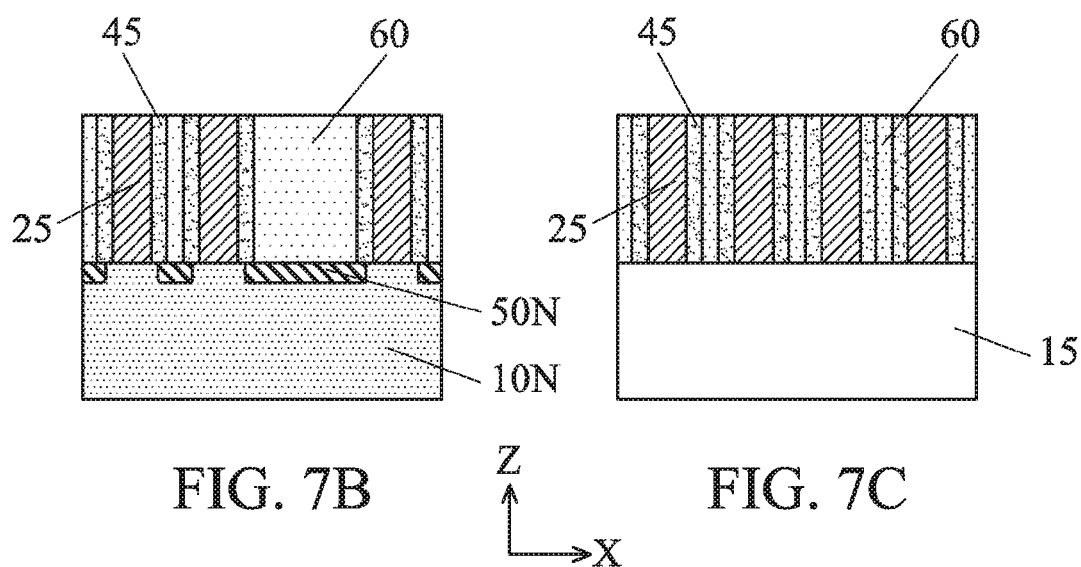
FIG. 7B
FIG. 7C

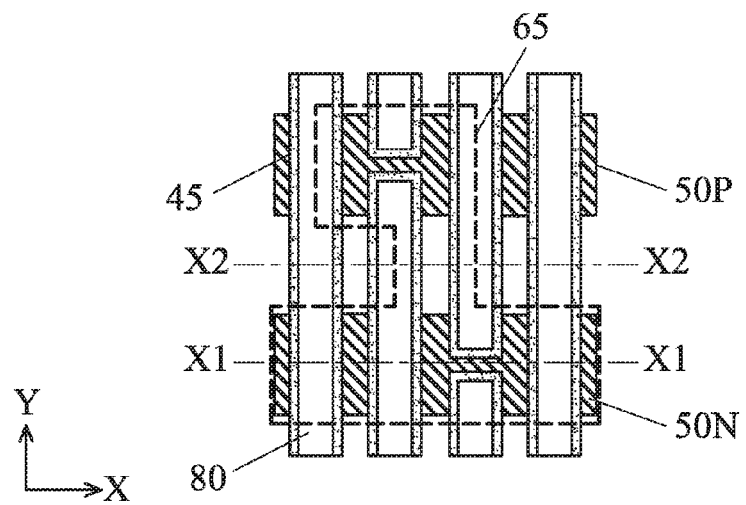
FIG. 10A
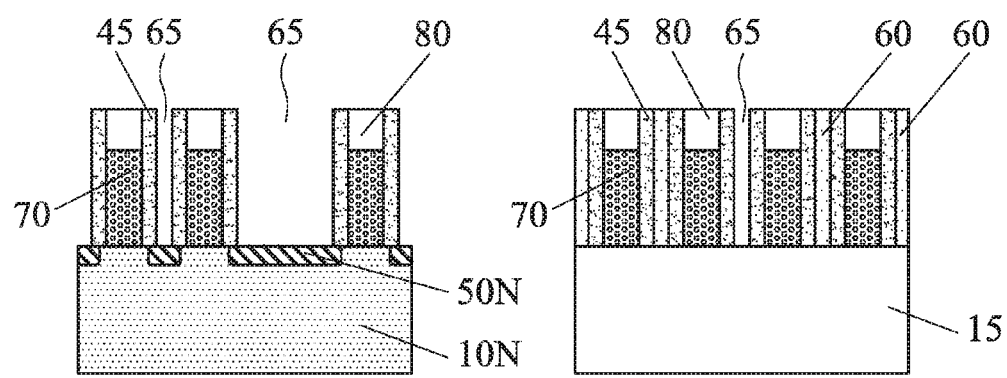
FIG. 10B  FIG. 10C
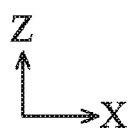

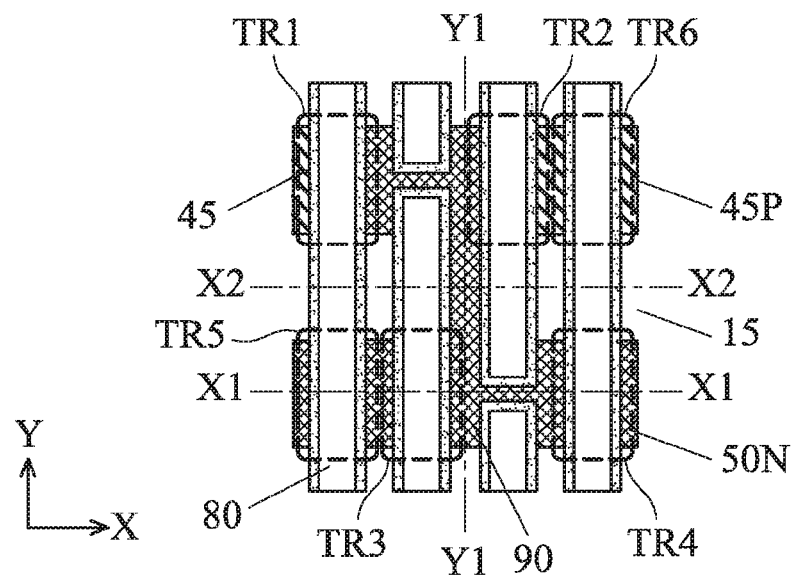
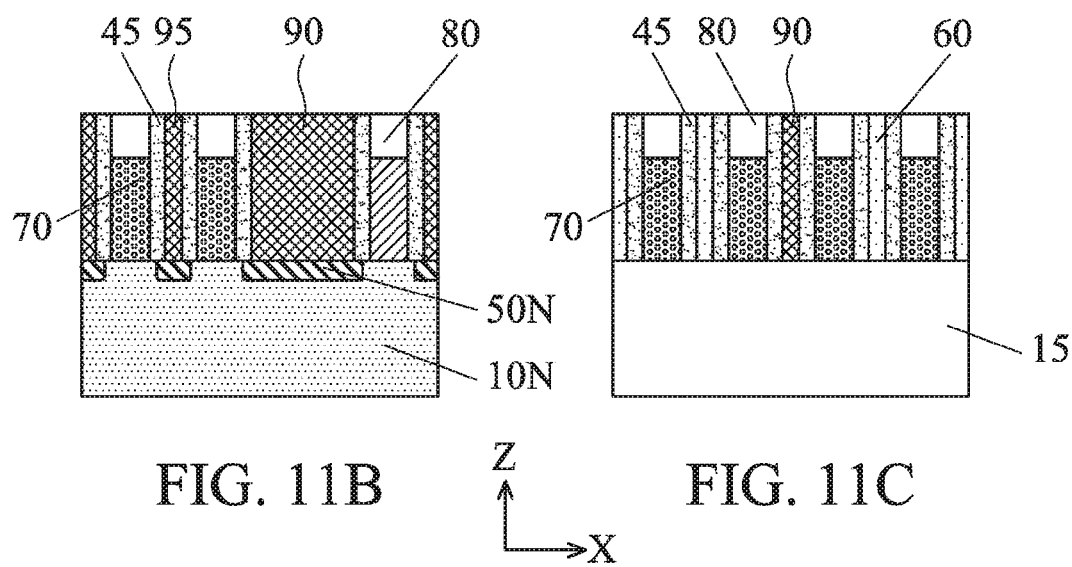
FIG. 11A
FIG. 11B  FIG. 11C

METHOD FOR FABRICATING A LOCAL INTERCONNECT IN A SEMICONDUCTOR DEVICE

TECHNICAL FIELD

The disclosure relates to a method for manufacturing a semiconductor device, and more particularly to a structure and a manufacturing method for a local interconnect connecting source/drain regions.

BACKGROUND

With a decrease of dimensions of semiconductor devices with a complex layout structure, a local interconnect that connects a source/drain region to another source/drain region has been developed. A local interconnect is a conductive layer disposed below the first metal wiring layer, and connects elements having a relatively short distance. In designing standard cells, local interconnects enhance design flexibility and minimize the size of the standard cells. It has been required to provide structures and manufacturing processes for a local interconnect for more design flexibility and higher reliability.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A and 1B to 12 show exemplary views illustrating a sequential fabrication process of a semiconductor device according to one embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1A and 1B to 12 show exemplary views illustrating a sequential fabrication process of a semiconductor device according to one embodiment of the present disclosure. In these figures, some layers/features are omitted for simplification. It is understood that additional operations can be provided before, during, and after processes shown by these figures, and some of the operations described below can be replaced or eliminated, for additional embodiments of the method. The order of the operations/processes may be interchangeable.

Figure 1A:
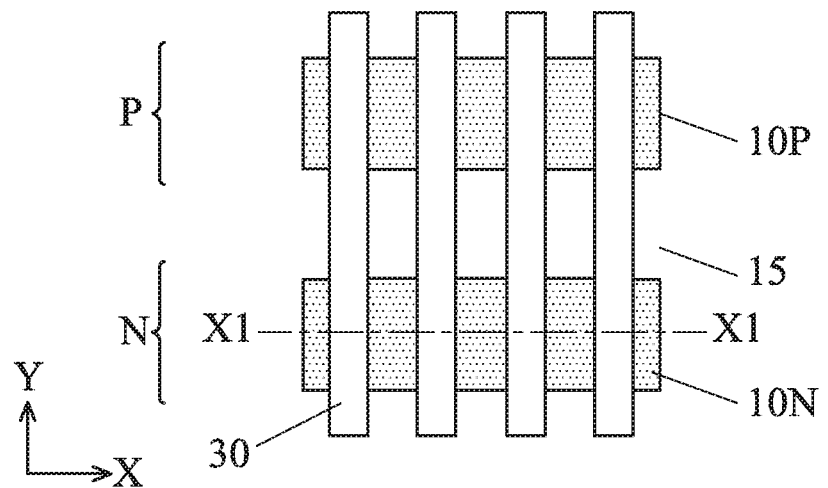
Figure 1B:
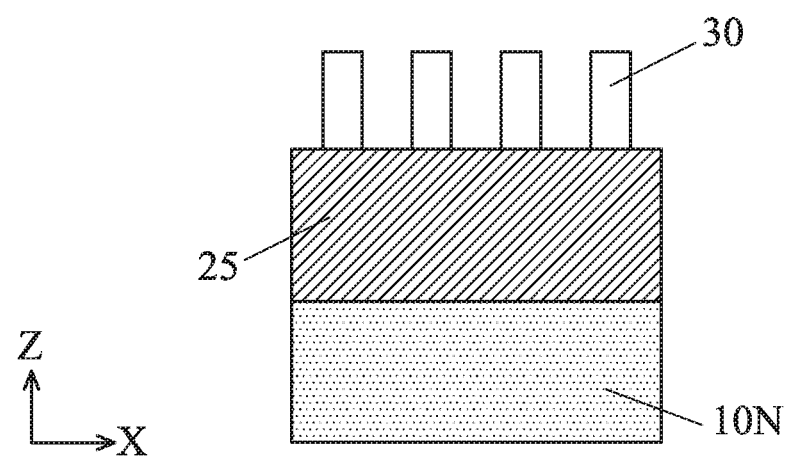

FIGS. 1A and 1B show one of the stages of a sequential fabrication process of a semiconductor device according to one embodiment of the present disclosure. FIG. 1A shows a plan (top) view, and FIG. 1B shows a cross sectional view along line X1-X1 of FIG. 1A.

As shown in FIGS. 1A and 1B, fin structures 10N and 10P, as active regions, separated by an isolation insulating region 15, such as shallow trench isolation, are formed over a substrate (not shown). In this embodiment, the fin structure 10N is for n-type fin field effect transistor transistors (Fin FETs) and the fin structure 10P is for p-type Fin FETs. In other embodiments, both the fin structures 10N and 10P are for the same conductivity type Fin FETs.

The substrate is, for example, a p-type silicon substrate with an impurity concentration in a range from about $1\times10^{15}$ $cm^{-3}$ to about $1\times10^{18}$ $cm^{-3}$. In other embodiments, the substrate is an n-type silicon substrate with an impurity concentration in a range from about $1\times10^{15}$ $cm^{-3}$ to about $1\times10^{18}$ $cm^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on insulator) substrate.

The fin structures are formed by, for example, trench-etching the substrate.

The isolation insulating regions 15 includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating region over the fin structures, a planarization operation is performed so as to remove part of the isolation insulating region. The planarization operation may include a chemical mechanical polishing (CMP) and/or an etch-back process. Then, the isolation insulating region is further removed (recessed) so that the upper regions of the fin structures are exposed.

A dummy layer 20 for dummy gate electrodes and a dummy insulating layer (not shown) are formed over the fin structures 10N, 10P and the isolation insulating regions 15. In FIG. 1A, the dummy layer 20 is omitted (transparent). The dummy layer 20 is, for example, a poly-silicon layer formed by chemical vapor deposition (CVD). Hard mask patterns 30 are then formed over the dummy layer 20. In one embodiment, a thickness of the dummy layer 20 is in a range from about 100 nm to about 35 nm, and a thickness of the hard mask patterns 30 is in a range from about 50 nm to about 200 nm.

The hard mask patterns 30 include one or more layers of dielectric material. One or more blanket layers of dielectric material are formed over the dummy layer 20, and a patterning operation including lithography and dry etching is performed to obtain the hard mask patterns 30. In one embodiment, the hard mask patterns 30 include a silicon oxide layer and a silicon nitride layer disposed on the silicon oxide layer. In other embodiments, the silicon oxide layer is disposed on the silicon nitride layer.

Figure 2A:
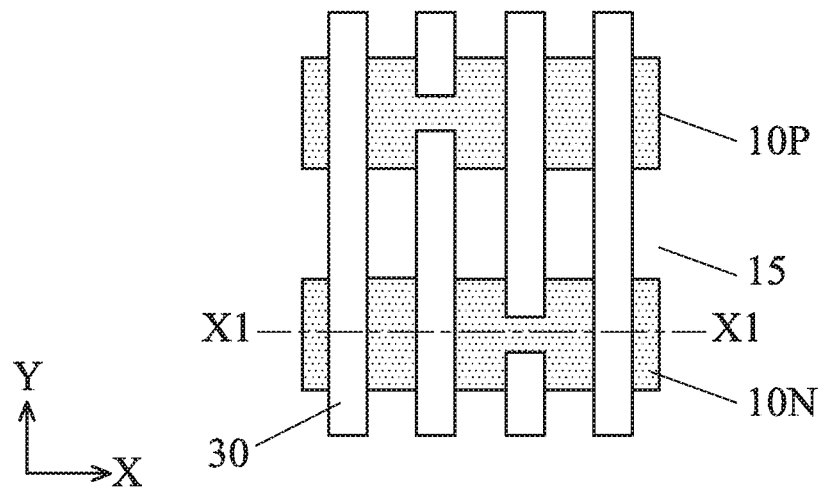
Figure 2B:
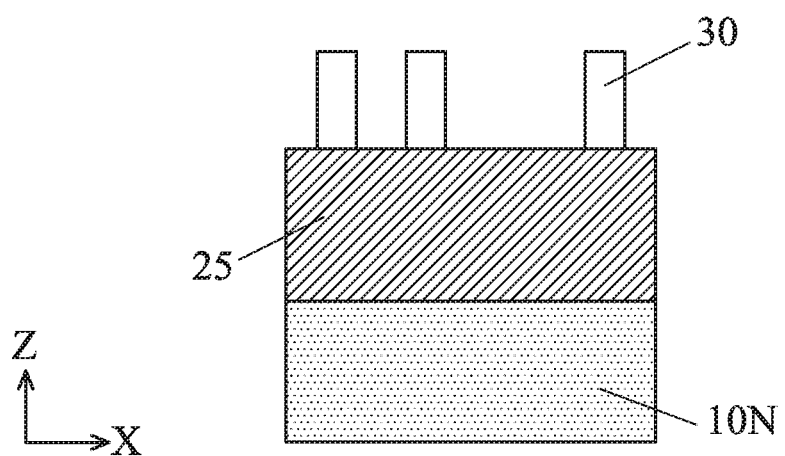

Next, as shown in FIGS. 2A and 2B, some of the hard mask patterns 30 are divided into plural pieces, each corresponding to one dummy gate pattern. FIG. 2A shows a plan (top) view, and FIG. 2B shows a cross sectional view along line X1-X1 of FIG. 2A. In FIG. 2A, the dummy layer 20 is omitted (transparent).

Figure 3A:
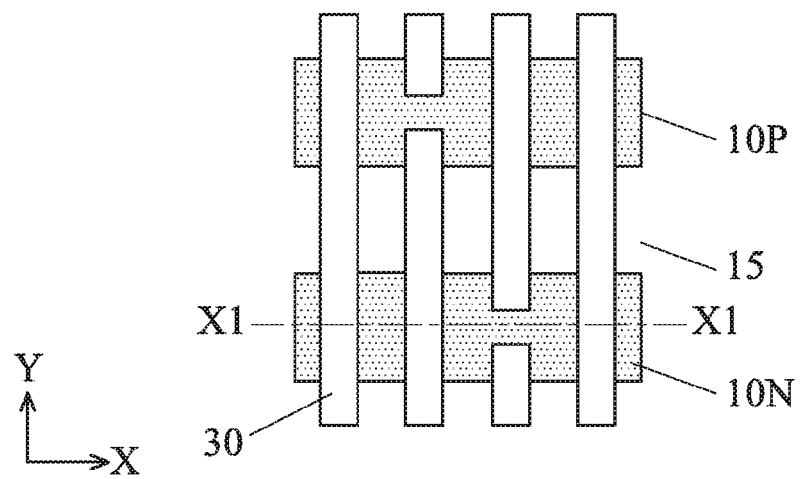
Figure 3B:
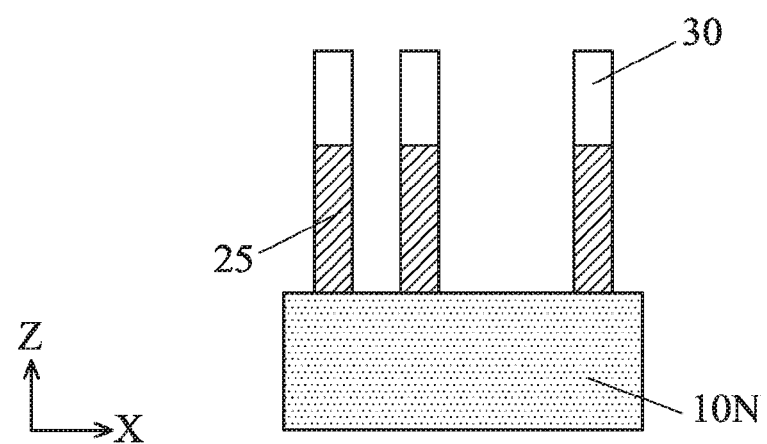

By using the divided hard mask patterns 30, the dummy layer 20 is patterned into dummy gate electrodes 25, as shown in FIGS. 3A and 3B. FIG. 3A shows a plan (top) view, and FIG. 3B shows a cross sectional view along line X1-X1 of FIG. 3A. In other embodiments, the dummy layer is patterned and then the patterned dummy layers are divided into plural pieces. In such a case, however, the dividing the patterned dummy layers may require etching for high aspect ratio patterns.

Figure 4A:
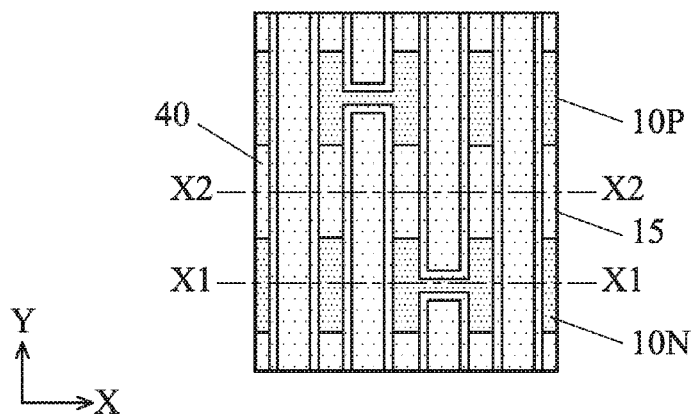
Figure 4B:
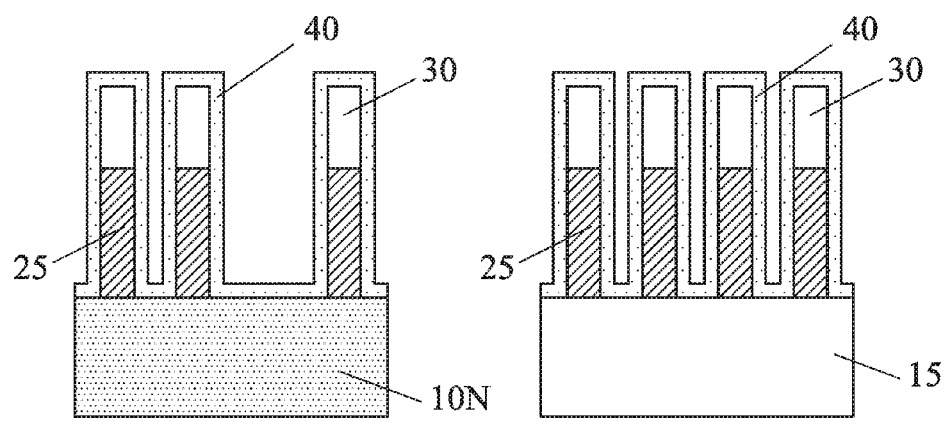
Figure 4C:

Then, as shown in FIGS. 4A-4C, a blanket layer 40 for sidewall spacers is formed over the patterned dummy gate electrodes 25 with hard mask patterns 30. FIG. 4A shows a plan (top) view, FIG. 4B shows a cross sectional view along line X1-X1 of FIG. 4A, and FIG. 4C shows a cross sectional view along line X2-X2 of FIG. 4A.

The blanket layer 40 includes one or more layers of insulating material such as $SiO_2$, SiN, SiCN, SiON, SiOCN, formed by low pressure CVD (LPCVD), plasma CVD or atomic layer deposition (ALD). As shown in FIGS. 4B and 4C, the blanket layer is comformally formed over the patterned dummy gate electrodes 25 with hard mask patterns 30, the fin structures and the isolation insulating region 15. In one embodiment, a nitride-based insulating material is used as the blanket layer 40, having a thickness in a range from about 5 nm to about 10 nm.

Figure 5A:
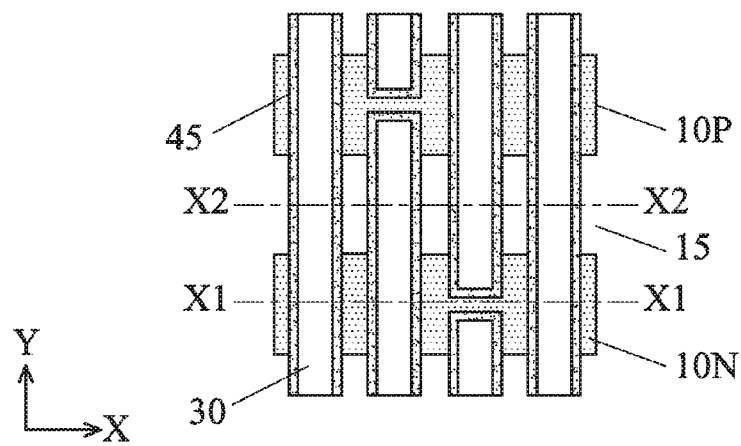
Figures 5B, 5C:
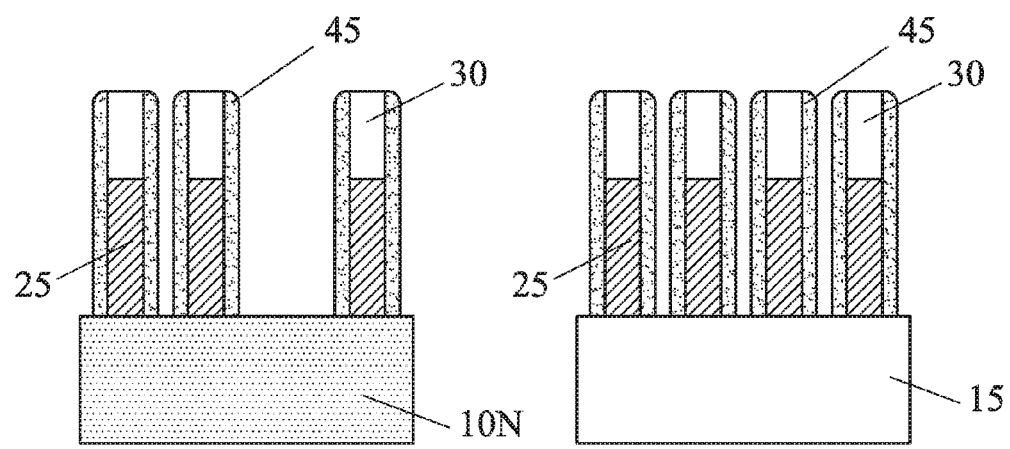

Then, as shown in FIGS. 5A-5C, anisotropic etching is performed so as to form sidewall spacers 45 on both sidewalls of the patterned dummy gate electrodes 25 with hard mask patterns 30. FIG. 5A shows a plan (top) view, FIG. 5B shows a cross sectional view along line X1-X1 of FIG. 5A, and FIG. 5C shows a cross sectional view along line X2-X2 of FIG. 5A.

Figure 6A:
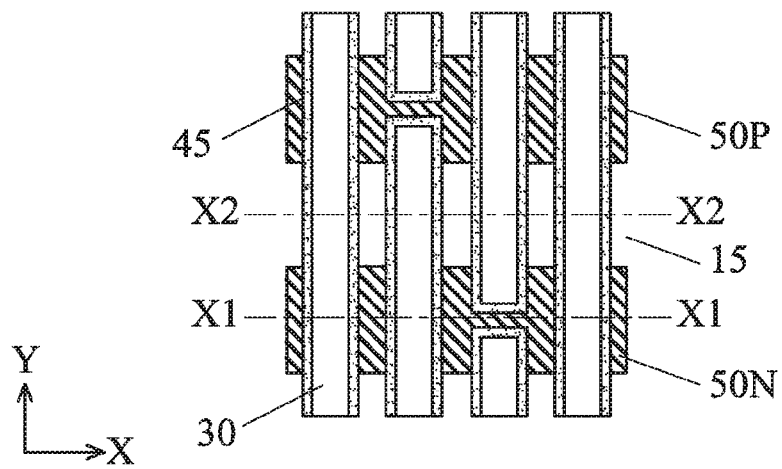
Figures 6B, 6C:
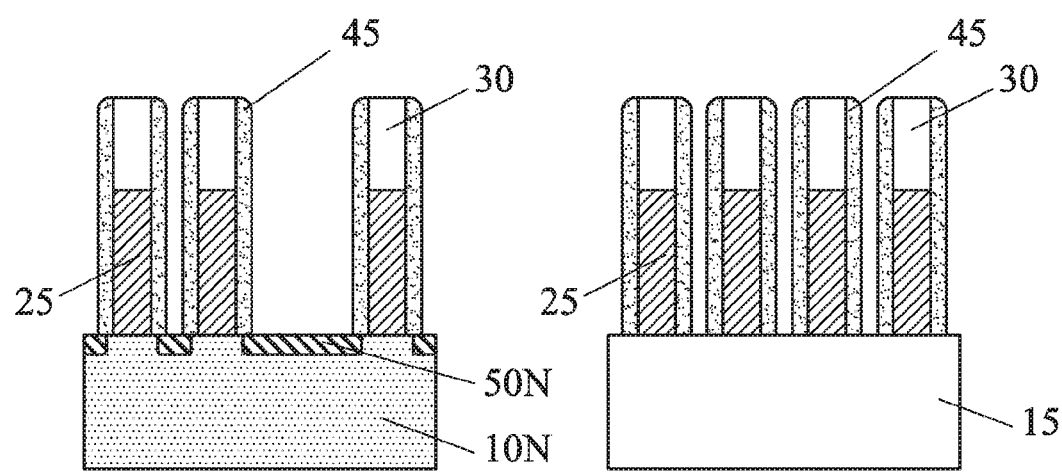

After the sidewall spacers are formed, source/drain regions 50N, 50P are formed, as shown in FIGS. 6A-6C. FIG. 6A shows a plan (top) view, FIG. 6B shows a cross sectional view along line X1-X1 of FIG. 6A, and FIG. 6C shows a cross sectional view along line X2-X2 of FIG. 6A. In the present disclosure, a source and a drain are interchangeably used.

The fin structures not covered by the dummy gate electrodes are recessed below the upper surface of the isolation insulating region. Then, source/drain regions 50N, 50P are formed over the recessed fin structures by using an epitaxial growth method. The source/drain regions may include a strain material to apply stress to the channel regions. Examples of the strain material are SiC, SiP or SiCP for n-type Fin FET, and SiGe for p-type Fin FET when the fin structure is Si. In other embodiments, the source/drain regions are formed by ion implantation. A silicide layer formed by, for example, Ti, Ni, Ta, Co or W may be formed in the source/drain regions.

After the source/drain structures are formed, an insulating layer 60 is formed over the dummy gate structures. The insulating layer 60 includes one or more layers of insulating material. In this embodiment, silicon oxide or a silicon oxide-based insulating material is used. Then, a planarization operation, such as CMP, is performed to remove upper portions of the insulating layer 60 and the hard mask pattern 30 on the dummy gate electrodes 25, as shown in FIGS. 7A-7C. FIG. 7A shows a plan (top) view after the metal gate patterns are formed, FIG. 7B shows a cross sectional view along line X1-X1 of FIG. 7A, and FIG. 7C shows a cross sectional view along line X2-X2 of FIG. 7A. In FIG. 7A, the insulating layer 60 is omitted.

Figure 8A:
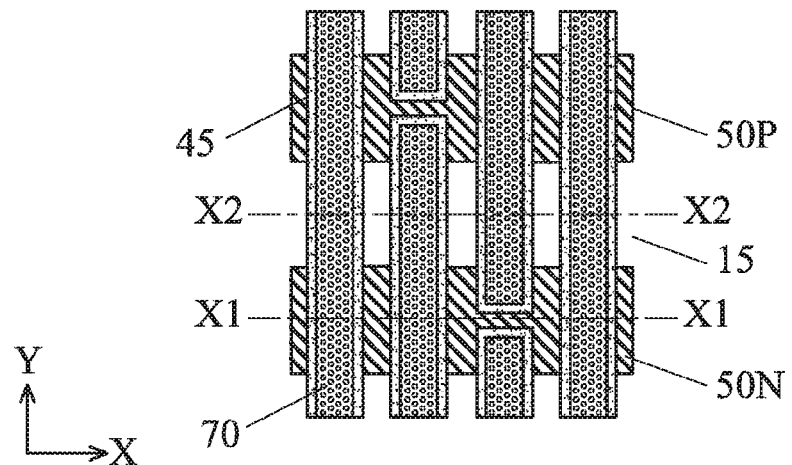
Figures 8B, 8C:
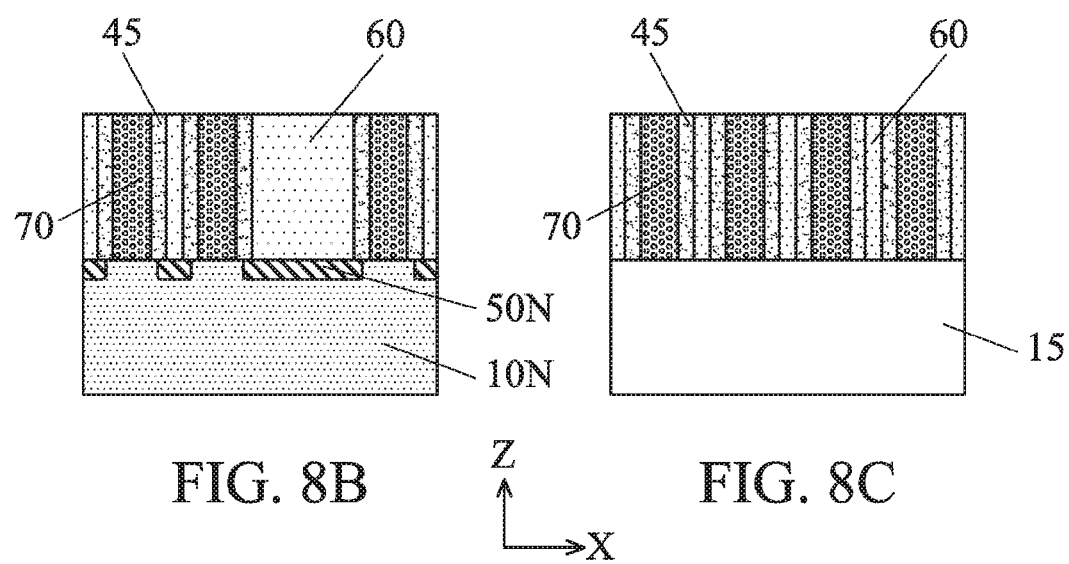

After the planarization operation, the dummy gate structures (dummy gate electrodes and dummy insulating layers) are removed so as to make gate spaces. Then, in the gate spaces, metal gate structures including metal gate electrodes 70 and gate dielectric layers (not shown), such as a high-k dielectric layer, are formed, as shown in FIGS. 8A-8C. FIG. 8A shows a plan (top) view after the metal gate patterns are formed, FIG. 8B shows a cross sectional view along line X1-X1 of FIG. 8A, and FIG. 8C shows a cross sectional view along line X2-X2 of FIG. 8A. In FIG. 8A, the insulating layer 60 is omitted.

The metal gate electrode 70 includes one or more layers of metal material, such as Al, Cu, W, Ti, Ta, TiN, TiAl, TiAlC, TiAlN, TaN, NiSi, CoSi, other conductive materials. The metal gate electrode 70 may be made by CVD, physical vapor deposition (PVD), ALD or electroplating. The gate dielectric layer (not shown) includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The gate dielectric layer may be made by CVD, PVD or ALD. In some embodiments, one or more work function adjustment layers (not shown) are interposed between the gate dielectric layer and the metal gate electrodes 70. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-type FET, one or more of TaN, TaAlC, TiN, TiC, Co, TiAl, HfTi, TiSi and TaSi is used as the work function adjustment layer, and for the p-type FET, one or more of TiAlC, Al, TiAl, TaN, TaAlC, TiN, TiC and Co is used as the work function adjustment layer.

Figure 9A:
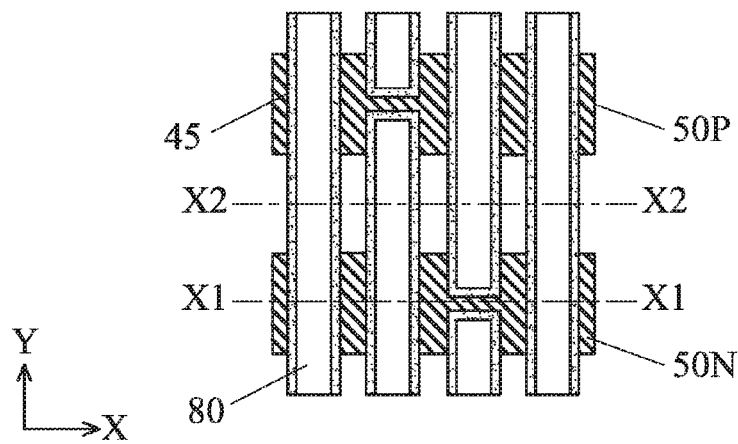
Figures 9B, 9C:
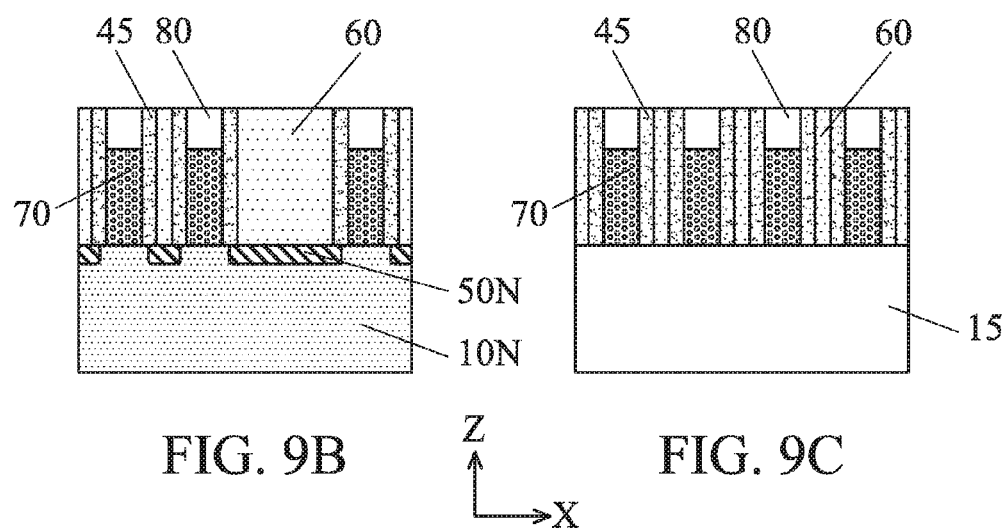

Then, as shown in FIGS. 9A-9C, the metal gate electrodes 70 are recessed and cap insulating layers 80 are formed. FIG. 9A shows a plan (top) view after the metal gate patterns are formed, FIG. 9B shows a cross sectional view along line X1-X1 of FIG. 9A, and FIG. 9C shows a cross sectional view along line X2-X2 of FIG. 9A. In FIG. 9A, the insulating layer 60 is omitted. The cap insulating layers 80 include one or more layers of insulating material, such as $SiO_2$, SiN, SiON, SiCN or SiOCN. In this embodiment, SiN or a silicon nitride-based material is used as the cap insulating layer 80. The cap insulating layers 80 are formed by depositing a blanket layer of insulating material by CVD and performing a planarization operation (e.g., CMP).

After the cap insulating layers 80 are formed, an opening 65 is formed in the insulating layer 60, as shown in FIGS. 10A-10C. FIG. 10A shows a plan (top) view after the metal gate patterns are formed, FIG. 10B shows a cross sectional view along line X1-X1 of FIG. 10A, and FIG. 10C shows a cross sectional view along line X2-X2 of FIG. 10A. In FIG. 10A, the insulating layer 60 is omitted, and the perimeter of the opening 65 is shown by broken lines.

By patterning the insulating layer 60, a surface of at least a part of the source/drain regions 50P and 50N and a surface of a part of the isolation region are exposed in the opening 65.

In this embodiment, the sidewall spacers 45 and the cap insulating layers 80 are made of a silicon nitride-based material (e.g., SiN), while the insulating layer 60 is made of a silicon-oxide-based material (e.g., $SiO_2$). Accordingly, during the oxide etching of the insulating layer 60, the source/drain regions 50N, 50P are exposed in a self-aligned manner without damaging the metal gate electrodes 70. The upper surface of the isolation insulating region 15 may be etched during the oxide etching of the insulating layer 60.

Figure 11D:
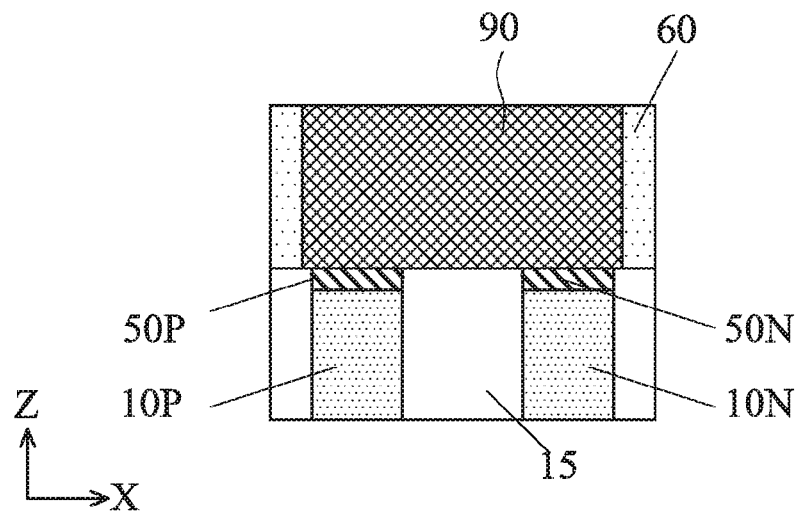

In the opening 65, a conductive material is filled to form a local interconnect 90, as shown in FIGS. 11A-11D. FIG. 11A shows a plan (top) view after the metal gate patterns are formed, FIG. 11B shows a cross sectional view along line X1-X1 of FIG. 11A, FIG. 11C shows a cross sectional view along line X2-X2 of FIG. 11A and FIG. 11D shows a cross sectional view along line Y1-Y1 of FIG. 11A. In FIG. 11A, the insulating layer 60 is omitted.

One or more layers of metal material, such as tungsten, titanium, cobalt and nickel, or silicide thereof, or other suitable materials, are formed over the structure of FIGS. 10A-10C, and a planarization operation, such as CMP, is performed, so as to obtain the structure of FIGS. 11A-11D. The opening 65 is filled by the metal material, thereby forming a local interconnect 90 connecting the source/drain region 50N and the source/drain region 50P.

As shown in FIGS. 11B-11D, the local interconnect 90 is in contact with the upper surface of the source/drain regions 50N and 50P and the upper surface of a part of the isolation region 15. The local interconnect 90 is in contact with the sidewall spacers 45, and upper surfaces of the cap insulating layers 8, upper surfaces (top portion) of the sidewall spacers 45 and upper surfaces of the local interconnect 90 are substantially flush with each other, i.e., on the same plane. In this disclosure, when differences in heights of features are less than 10% of the highest feature, it is considered that the features are substantially flush with each other. In one embodiment, the height of the local interconnect 90 from the surface of the source/drain regions is in a range from about 60 nm to about 180 nm.

FIG. 11A shows six Fin FETs TR1, TR2, TR3, TR4, TR5 and TR6. The local interconnect 90 connects the source/drain regions of TR1, TR2, TR3 and TR4. Further, a local metal layer 95, which is fabricated at the same time as the local interconnect 90, is formed on the shared source/drain region between Fin FETs TR3 and TR5. Such a local metal layer 95 may reduce a contact resistance to the source/drain regions.

Figure 12:
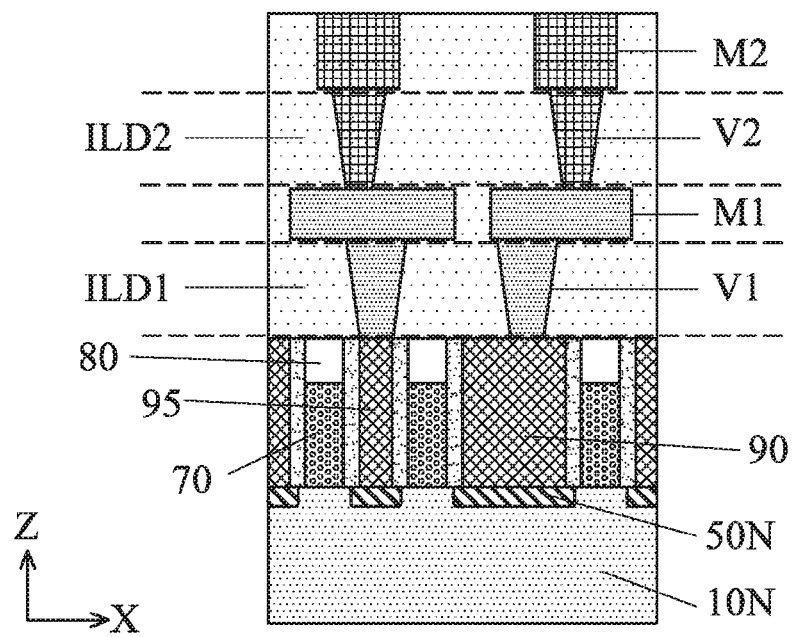

FIG. 12 shows an exemplary cross sectional view of a semiconductor device according to one embodiment of the present disclosure.

After the local interconnect 90 is formed, a first interlayer dielectric (ILD) layer ILD1 is formed over the structure of FIGS. 11A-11D. Then, a patterning operation is performed to form via holes, and the via holes are filed with one or more conductive materials so as to form a first via plug V1. A first metal wiring M1 is also formed over the first via plug V1. The first metal wiring M1 and the first via plug V1 can be formed by a dual damascene method. Some of the first via plus V1 are connected to the local interconnect 90. Further, a second ILD layer ILD2 is formed over the first metal wiring M1. Then, a patterning operation is performed to form via holes, and the via holes are filed with one or more conductive materials so as to form a second via plug V2. A second metal wiring M2 is also formed over the second via plug V2. The second metal wiring M2 and the second via plug V1 can be formed by a dual damascene method. The first and second ILD layers includes one or more layers of insulating material such as silicon oxide based material such as silicon dioxide ($SiO_2$) and SiON.

Figure 13A:
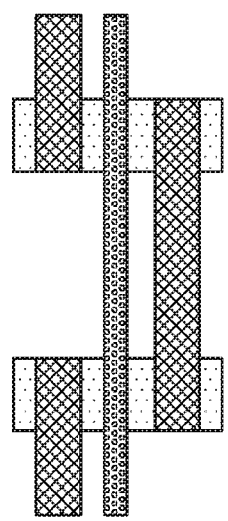
FIG. 13A-13C show exemplary layout structures of a semiconductor device according to various aspects of the present disclosure.
Figure 13B:
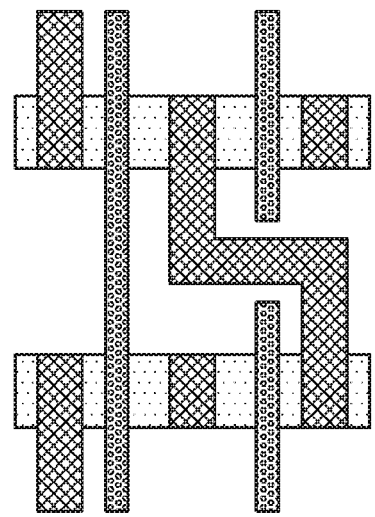
Figure 13C:
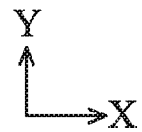
Figure 13C:
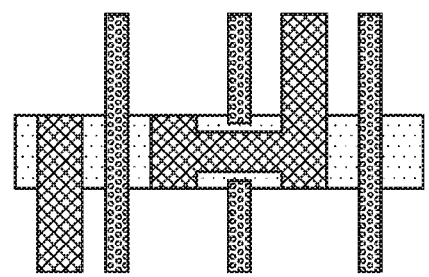

FIG. 13A-13C show exemplary layout structures of a semiconductor device according to various aspects of the present disclosure. The various arrangements of local interconnects are possible within a standard cell. In one embodiment, the local interconnect extends linearly in parallel with a gate electrode, in a plan view. In other embodiments, the local interconnect has a crank handle shape, in a plan view.

In FIGS. 11A, 13B and 13C, ends of gate patterns faces with each other with a space between them, and the local interconnect passes through the space. The space may be located over the source/drain region, or may be located over the isolation region.

The various embodiments or examples described herein offer several advantages over the existing art. For example, in the present disclosure, since a local interconnect (and a local metal layer) is formed in a self-aligned manner, short circuits caused by process variation (e.g., alignment errors in a lithography operation) can be avoided. Further, design flexibility in designing standard cells can be enhanced.

It will be understood that not all advantages have been necessarily discussed herein, no particular advantage is required for all embodiments or examples, and other embodiments or examples may offer different advantages.

According to one aspect of the present disclosure, a semiconductor device includes a first transistor having a first gate, a first source and a first drain, a second transistor having a second gate, a second source and a second drain, an isolation region separating the first transistor from the second transistor, and a local interconnect connecting at least one of the first source and the first drain to at least the second source and the second drain. The local interconnect is in contact with a surface of the at least one of the first source and the first drain, a surface of the at least one of the second source and the second drain and a surface of a part of the isolation region.

According to another aspect of the present disclosure, a semiconductor device includes source/drain regions extending in a first direction, an isolation region separating the source/drain regions, a first gate pattern extending in a first direction, a second gate pattern extending in the first direction, a third gate pattern extending in the first direction and aligned with the second gate pattern in the first direction, and a local interconnect. One end of the second gate pattern faces one end of the third pattern with a space between them. The local interconnect is in contact with at least one of a surface of the at least one of the source/drain regions and a surface of the isolation region. The local interconnect extends in a second direction crossing the first direction and passes through the space.

In accordance with yet another aspect of the present disclosure, in a method of manufacturing a semiconductor device, an isolation region is formed in a substrate. A first transistor structure and a second transistor structure are formed over the substrate. The first transistor structure includes a first gate, a first cap insulating layer disposed over the first gate, a first sidewall spacer disposed on side faces of the first gate and the first cap insulating layer, a first source and a first drain. The second transistor structure includes a second gate, a second cap insulating layer disposed over the second gate, a second sidewall spacer disposed on side faces of the second gate and the second cap insulating layer, a second source and a second drain. A first insulating layer is formed between the first and second transistor structures. An opening is formed in the first insulating layer so that a surface of at least one of the first source and the first drain, a surface of the at least the second source and the second drain and a surface of a part of the isolation region are exposed. The opening is filled with a conductive material so as to form a local interconnect.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first transistor having a first gate extending in a first direction, a first source and a first drain, the first source and the first drain being located at both sides of the first gate in a second direction crossing the first direction in a plan view;
   a second transistor having a second gate extending in the first direction, a second source and a second drain, the second source and the second drain being located at both sides of the second gate in the second direction in the plan view;
   an isolation region formed by an insulating material and separating the first transistor from the second transistor along the first direction in the plan view; and
   a local interconnect electrically connecting at least one of the first source and the first drain to at least one of the second source and the second drain, wherein:
   the local interconnect is in contact with a surface of the at least one of the first source and the first drain, a surface of the at least one of the second source and the second drain and an upper surface of a part of the isolation region.

2. The semiconductor device of claim 1, wherein:
   the first gate is provided with first sidewall spacer layers, and
   the local interconnect is in contact with one of the first sidewall spacer layers.

3. The semiconductor device of claim 2, wherein an uppermost portion of the local interconnect is located at the same level as an uppermost portion of the first sidewall spacer layers.

4. The semiconductor device of claim 3, wherein:
   the first gate is provided with a cap insulating layer, and
   the uppermost portion of the local interconnect is located at the same level as an uppermost portion of the cap insulating layer.

5. The semiconductor device of claim 4, wherein the first gate is made of one or more of Al, Cu, W, Ti, Ta, TiN, TiAl, TiAlC, TiAlN, TaN, NiSi and CoSi.

6. The semiconductor device of claim 1, wherein the first transistor is a fin field effect transistor (FinFET) having a first fin structure extending in the second direction and the first gate is disposed over the first fin structure and the second transistor is a FinFET having a second fin structure extending in the second direction and the second gate is disposed over the first fin structure.

7. The semiconductor device of claim 1, wherein a conductivity type of the first transistor is different from a conductivity type of the second transistor.

8. The semiconductor device of claim 1, wherein the local interconnect extends linearly in parallel with at least one of the first and second gates in a plan view.

9. The semiconductor device of claim 1, wherein the local interconnect has a crank handle shape in a plan view.

10. The semiconductor device of claim 1, further comprising:
    a third FinFET having a third gate, a third source and a third drain,
    wherein the local interconnect is further in contact with a surface of the at least one of the third source and the third drain.

11. A semiconductor device comprising:
    source/drain regions extending in a first direction;
    an isolation region separating the source/drain regions;
    a first gate pattern extending in a first direction;
    a second gate pattern extending in the first direction;
    a third gate pattern extending in the first direction and aligned with the second gate pattern in the first direction; and
    a local interconnect, wherein:
    one end of the second gate pattern faces one end of the third pattern with a space therebetween,
    the local interconnect is in contact with at least one of a surface of the at least one of the source/drain regions and a surface of the isolation region, and
    the local interconnect extends in a second direction crossing the first direction and passes through the space.

12. The semiconductor device of claim 11, wherein:
    the space is located over the at least one of the source/drain regions.

13. The semiconductor device of claim 11, wherein:
    the space is located over the isolation region.

14. The semiconductor device of claim 13, wherein the local interconnect has a crank handle shape in a plan view.

15. The semiconductor device of claim 13, wherein:
    the source/drain regions includes a first source/drain regions and a second source/drain regions,
    the first gate pattern is disposed over the first and second source/drain regions,
    the second gate pattern is disposed over the first source/drain regions,
    the third gate pattern is disposed over the second source/drain regions, and
    the local interconnect is in contact with a surface of the first source/drain regions and a surface of the second source/drain regions.

16. The semiconductor device of claim 11, wherein the source/drain regions are formed over fin structures.

17. A method of manufacturing a semiconductor device, the method comprising:
    forming an isolation region in a substrate;
    forming a first transistor structure and a second transistor structure over the substrate, the first transistor structure including a first gate, a first cap insulating layer disposed over the first gate, a first sidewall spacer disposed on side faces of the first gate and the first cap insulating layer, a first source and a first drain, the second transistor structure including a second gate, a second cap insulating layer disposed over the second gate, a second sidewall spacer disposed on side faces of the second gate and the second cap insulating layer, a second source and a second drain;

forming a first insulating layer between the first and second transistor structures;

forming an opening in the first insulating layer so that a surface of at least one of the first source and the first drain, a surface of the at least one of the second source and the second drain and a surface of a part of the isolation region are exposed; and filling the opening with a conductive material so as to form a local interconnect.

18. The method of claim 17, wherein the forming the first transistor structure includes:

forming an active region;

forming a dummy gate pattern over the active region and the isolation region;

forming the first sidewall spacer;

forming the first source and the second source over the active region;

removing the dummy gate pattern, thereby forming a gate space;

forming a metal material in the gate space; and forming the first cap insulating layer over the metal material.

19. The method of claim 18, wherein the forming the dummy gate pattern includes:

forming a dummy layer over the active region and the isolation region;

forming a hard mask pattern over the dummy layer;

dividing the hard mask pattern; and patterning the dummy layer by using the divided hard mask pattern as an etching mask.

20. The method of claim 19, wherein the filling the opening with a conductive material includes a planarization operation so that an uppermost portion of the local interconnect is located at the same level as an uppermost portion of the first cap insulating layer.

* * * * *